April 22, 1969 J. A. NARUD ET AL 3,440,551

LINE DRIVER CIRCUITS ADAPTED TO DRIVE HIGHLY CAPACITIVE LOADS

Filed Nov. 26, 1965

INVENTORS
Jan A. Narud
Walter C. Seelbach
BY
Mueller, Aichele & Rauner
ATTYS.

United States Patent Office 3,440,551
Patented Apr. 22, 1969

3,440,551
LINE DRIVER CIRCUITS ADAPTED TO DRIVE HIGHLY CAPACITIVE LOADS

Jan A. Narud and Walter C. Seelbach, Scottsdale, Ariz., assignors to Motorola, Inc., Franklin Park, Ill., a corporation of Illinois Filed Nov. 26, 1965, Ser. No. 509,778
Int. Cl. H03f 3/18
U.S. Cl. 330—13 9 Claims

ABSTRACT OF THE DISCLOSURE

Disclosed are line driver circuits for driving highly capacitive loads, and these circuits include output complementary transistors which are connected to an output terminal. The complementary transistors conduct to alternately charge and discharge capacitive loads connected to the output terminal. DC level shifting circuit means are connected between the inputs of the complementary transistors so that the complementary transistors conduct in the steady state and present a low impedance charge and discharge path for capacitive loads connected to the output terminal.

This invention relates to line driver circuits for use with semiconductor logic circuits and in particular to line driver circuits adapted to drive capacitive loads.

In many applications of logic circuits it is required that the logic circuit drive a large number of logic circuits or other loads. In order to provide sufficient power to drive the required loads, a line driver is coupled between the output of the logic circuit and the load which is to be driven. Conventional line driving circuits consist of a transistor amplifier, usually in the form of an emitter follower, which amplifies the output power of the logic circuit. When the emitter follower transistor is biased to conduction the output resistance of the driving circuit is low and the line driver is capable of providing large amounts of power quickly so that there is no degradation of the response time of the logic circuit. However, when the emitter follower transistor is biased to non-conduction the energy stored in the circuit being driven must be dissipated through the emitter follower resistor. This increases the time constant of the circuit being driven and causes degradation of the response time of the logic circuit. This problem is particularly true in applications where the load driven by the line driver is capacitive and therefore capable of storing large amounts of energy.

It is therefore an object of this invention to provide a line driver circuit capable of driving capacitive loads without degradation of the response time of the logic circuit.

Another object of this invention is to provide a line driver circuit capable of driving capacitive loads and in which there is no DC offset voltage between the input signal and output signal of the line driver.

A feature of this invention is the provision of a line driver circuit having complementary output transistors coupled symmetrically so that the load is connected to the desired output voltage only through a transistor biased to conduction, thus maintaining the response time of the driving circuit at a minimum during switching operations.

Another feature of this invention is the provision of a line driver circuit including an input circuit having a complementary pair of transistors connected to compensate for the DC offset voltages of the line driver transistors so that there is no DC offset voltage between the input signal and the output signal of the line driver.

The invention is illustrated in the drawings of which;

In practicing this invention two line driver transistors of opposite conductivity types forming a complementary pair are coupled in series between a power supply and a reference potential. The emitter electrodes of the two transistors are coupled together and the output of the line driver is taken from these emitter electrodes. The input signal is applied directly to the base electrode of one of the line driver transistors and to the base electrode of the other line driver transistor through a pair of diodes connected in series. The pair of diodes provide the correct DC offset voltage to the input signal applied to the second line driver transistor so that when a signal is applied to the input, one of the line driver transistors is biased to conduction while the other is biased to non-conduction. Thus, when an input signal is received the output terminal is connected either directly to the power supply or to the reference potential through a single transistor and power is supplied to the load or received from the load with a minimum degradation in the response time of the logic circuits. In this circuit only one power supply is required if the logic circuits and load permit the line driver transistors to be connected to ground.

In a second embodiment of this invention the input circuit includes a second complementary pair of transistors coupling the input signal to the control electrodes of the line driver transistors. By using a complementary pair of transistors in this manner, the DC offset of the line driver transistors is compensated for by the DC offset potential of the input transistors so that the output signal has no DC offset with respect to the input signal.

Figure 1:
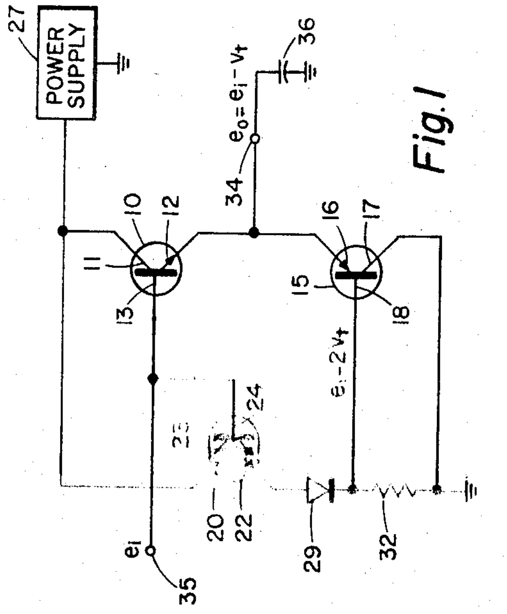
FIG. 1 is a schematic of a line driver incorporating the features of this invention.

In FIG. 1 there is shown a schematic of one embodiment of this invention. Driver transistors 10 and 15 are of opposite conductivity types and form a complementary pair coupled between power supply 27 and a reference potential. Emitter 12 of transistor 10 is coupled to emitter 16 of transistor 15. Output terminal 34 is coupled to emitters 12 and 16. Input terminal 35 is coupled to base electrode 13 of transistor 10 and to base electrode 24 of input transistor 20. Collector electrode 23 of input transistor 20 is coupled to power supply 27 and emitter electrode 22 of transistor 20 is coupled to diode 29. Diode 29 is coupled to base 18 of transistors 15 and to a reference potential through resistor 32.

As shown in FIG. 1 the voltage applied to base 13 of transistor 10 is equal to the input voltage $e_i$ while the voltage applied to base 18 of transistor 15 is equal to $e_i-2V_T$. $V_T$ is the base-emitter voltage drop across transistor 20 and diode 29. Transistor 20 could also be a diode but in this example of the circuit a transistor is used in order to provide current gain, thereby decreasing the load on the input circuit. There is another voltage drop $V_T$ between base 13 and emitter 12 of transistor 10 and a voltage rise of $V_T$ from emitter 16 to base 18 of transistor 15. Thus the voltage appearing at terminal 34 $e_o=e_i-V_T$.

In operation, assume output terminal 34 to be coupled to a capacitive load 36 and that the input signal voltage is low. Thus, the output voltage across capacitor 36 will also be low. When the input signal appearing at terminal 35 rises transistor 10 will be biased to conduction and transistor 15 will be biased to non-conduction. With transistor 10 biased to conduction a current path is established between power supply 27 through collector 11 and emitter 12 of transistor 10 to capacitor 36 charging the capacitor. Since the input signal will bias transistor 10 fully on the resistance of transistor 10 is low and the time constant of the charging circuit is low. Thus the response time of the circuit to the input signal will be low and there will be little degradation of the response time of the logic circuit.

When the input signal falls transistor 10 is biased to non-conduction and transistor 15 is biased to conduction. A discharge path for capacitor 36 is provided through emitter 16 and collector 17 of transistor 15 to a reference potential. Again since transistor 15 is fully conductive the resistance of this charge path is low and the time constant of the driving circuit is low so there will be little degradation of the response time of the logic circuit. During the standby period with no changes in the input signal, both transistors 10 and 15 are biased to a point where they both will barely conduct to maintain the potential applied to the load equal to the input voltage minus $V_T$. It is also possible that one or both of transistors 10 and 15 may be partially conducting during the period of change in the output signal. This will depend upon the rate of change of the input signal vs. the rate of change of the output signal.

Figure 2:
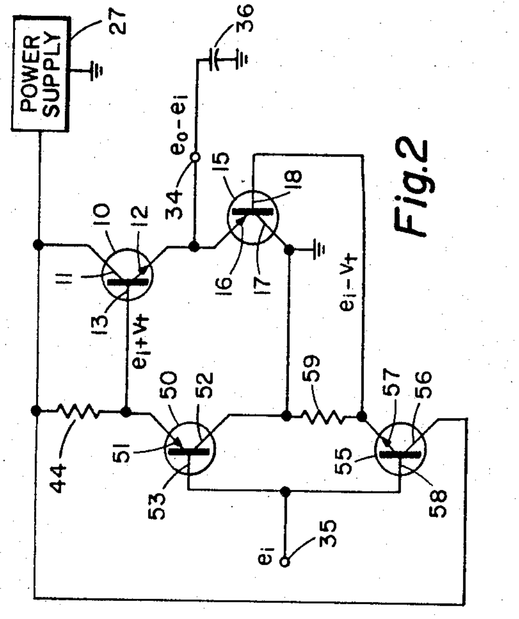
FIG. 2 is a schematic of a second embodiment of this invention in which there is no DC offset voltage between the input and output signal voltages.

FIG. 2 illustrates a second embodiment of this invention in which the output voltage $e_o$ is equal to the input voltage $e_i$. Portions of FIG. 2 identical to those of FIG. 1 have the same reference numerals. The input voltage is coupled from terminal 35 to base 53 of transistor 50 and base 58 of transistor 55. Thus, it is seen that the transistors 50 and 55 are connected in FIG. 2 to provide a DC voltage offset of $2V_T$ between the bases of complementary output transistors 10 and 15. In FIG. 1, the diode 29 combines with transistor 20 to provide the $2V_T$ offset between the bases of complementary output transistors, but in each case the series connected PN junctions between the bases of the transistors 10 and 15 constitute a DC level shifting means that provides a desired DC voltage level at the output transistors 10 and 15 to insure that both the output transistors 10 and 15 are biased conductive under steady state conditions. Transistors 50 and 55 form a complementary pair and form a pair of emitter follower circuits having emitter resistors 44 and 59, respectively. Collector 52 of transistor 50 is coupled to a reference potential and collector 56 of transistor 55 is coupled to power supply 27. The output of transistor 50 is coupled from emitter 51 to base 13 of transistor 10 and the output of transistor 55 is coupled from emitter 57 to base 18 of transistor 15. As can be seen from FIG. 2 the voltage applied to base 13 of transistor 10 is equal to $e_i+V_T$ since there is a rise of $V_T$ between base 53 and emitter 51 of transistor 50. The voltage applied to base 18 of transistor 15 is equal to $e_i-V_T$ as there is a voltage drop of $V_T$ between base 58 and emitter 57 of transistor 55. Since there is a rise of $V_T$ between emitter 16 and base 18 of transistor 15 and a drop of $V_T$ between base 13 and emitter 12 of transistor 10 the output voltage $e_o$ of the driver circuit is equal to $e_i$.

In operation assume $e_i$ is a low potential and rises to its high potential. The outputs of the emitter followers coupled to base 13 of transistor 10 and base 18 of transistor 15 follow the input voltage. Thus, transistor 10 is biased to conduction and transistor 15 is biased to non-conduction. Load capacitor 36 is coupled to power supply 27 through transistor 10 and charges to the potential which is equal to the input signal. When the input signal $e_i$ is reduced to its low potential transistor 10 is biased to non-conduction and transistor 15 is biased to conduction, thus connecting load capacitor 36 to ground through transistor 15. In the second embodiment it is also possible that both transistors 10 and 15 may be partially conducting during the period of change depending upon the rate of change of the input signal vs. the rate of change of the output signal.

Figure 3:
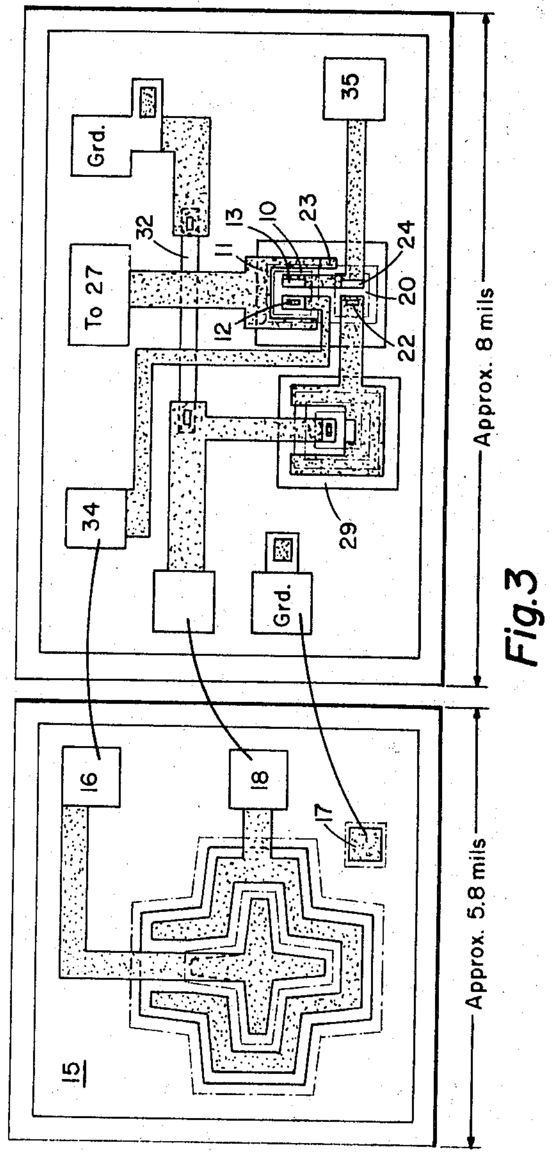
FIG. 3 is a drawing of integrated circuit dice incorporating the structure of this invention.

The circuits of FIGS. 1 and 2 are readily adaptable to being manufactured in an integrated circuit form. FIG. 3 illustrates the construction of two semiconductor dice which are interconnected to form the circuit of FIG. 1.

The portions of each die corresponding to the circuit elements shown in the schematic of FIG. 1 have the same reference numerals. In order to provide a PNP transistor having optimum charcateristics transistor 15 is formed on a separate die and interconnected with remainder of the circuit formed on another die. Both dice may then be placed in the same package.

Thus a line driver circuit particularly adapted to drive capacitive loads has been described. The circuit is simple in operation and economical to manufacture. The use of this driver circuit minimizes the effect of the load on the response time of the logic circuit to which it is coupled and in one embodiment there is no DC offset voltage between the input signal and the output signal of the line driver.

We claim:

1. A line driver for use with a logic circuit, including in combination, a power supply terminal coupled to a reference potential, an output terminal adapted to be coupled to a load, first transistor means coupled to said power supply terminal and said output terminal and having a first control electrode, second transistor means coupled to said reference potential and said output terminal and having a second control electrode, an input terminal adapted to receive a logic signal having a first potential and a second potential, input circuit means coupling said input terminal to said first and second control electrodes for applying said logic signal thereto, said first transistor means being responsive to said first potential of said control signal to be biased to conduction whereby said load is coupled to said power supply terminal through said first transistor means, said second transistor means being responsive to said second potential of said control signal to be biased to conduction whereby said load is coupled to said reference potential through said second transistor means, said input circuit means including DC level shifting means connected between said first and second transistor means for establishing a difference of potential between said first and second transistor means that will bias both said first and second transistor means conductive under steady state conditions.

2. A line driver according to claim 1 in which said first transistor means includes a first transistor of one conductivity type and said second transistor means includes a second transistor of the opposite conductivity type, said first and second transistors forming a complementary pair.

3. A line driver according to claim 2 wherein said DC level shifting means includes a third transistor of said one conductivity type coupled to said input terminal and to said second transistor for applying said logic signal to said second transistor, said DC level shifting means further includes a fourth transistor of said opposite conductivity type coupled to said input terminal and to said first transistor for applying said logic signal to said first transistor.

4. A line driver according to claim 2 wherein said input circuit means includes circuit means coupling said input terminal to one of said first and second transistors, said DC level shifting means comprising a first semiconductor device connected to said input terminal and a second semiconductor device connected between said first semiconductor device and the other one of said first and second transistors.

5. A line driver according to claim 2 wherein said first transistor includes a collector coupled to said power supply terminal, an emitter coupled to said output terminal and a base, said second transistor includes a collector coupled to said reference potential, an emitter coupled to said output terminal and a base, said input circuit means includes first resistance means coupled between said power supply terminal and said base of said first transistor and a second resistance means coupled between said reference potential and said base of said second transistor, said DC level shifting means including a third transistor of said opposite conductivity type having a collector coupled to said reference potential, an emitter coupled to said base of said first transistor and a base coupled to said input terminal, and said DC level shifting means further including a fourth transistor of said one conductivity type having a collector coupled to said power supply terminal, and an emitter coupled to said base of said second transistor and a base coupled to said input terminal.

6. A line driver according to claim 2 wherein said first transistor includes a collector coupled to said power supply terminal, an emitter coupled to said output terminal and a base, said second transistor includes a collector coupled to said reference potential, an emitter coupled to said output terminal and a base, said input circuit means includes circuit means coupling said input terminal to said base of said first transistor and further includes DC level shifting means comprising a first semiconductor device coupled to said input terminal and a second semiconductor device coupled between said first semiconductor device and the base of said second transistor, said first and second semiconductor devices maintaining a DC potential on the base of said second transistor that will bias said second transistor conductive in the steady state condition when a capacitive load at said output terminal has charged, said second transistor presenting a low impedance discharge path to said capacitive load at said output terminal when the input logic signal shifts to another level.

7. A line driver according to claim 6 wherein said first semiconductor device is a transistor of said one conductivity type and includes a collector coupled to said power supply terminal, an emitter coupled to said second semiconductor device and a base coupled to said input terminal.

8. A line driver according to claim 6 wherein said second semiconductor device is a diode having an offset voltage $V_T$, said first semiconductor device having an offset emitter-base voltage $V_T$ so that the difference in DC voltage levels between said input terminal and said base of said second transistor is $2V_T$, the difference in DC voltage levels between said input and output terminals being $1V_T$, thereby establishing a difference in potential of $1V_T$ between said output terminal and said base of said second transistor, and said difference of potential being sufficient to bias said second transistor slightly conductive under the steady state condition when a capacitive load at said output terminal has charged.

9. A line driver circuit operative to drive highly capacitive loads and including in combination: first and second complementary output transistors having their emitter-collector paths serially connected between a power supply terminal and a point of reference potential, an output terminal connected to a common node between said first and second output transistors, and an input terminal connected to the base of said first output transistor for receiving binary logic signals, DC level shifting means including first and second semiconductor devices serially connected between said input terminal and the base of said second transistor and providing a difference in DC voltage levels of $2V_T$ between said input terminal and the base of said second transistor, where $V_T$ is equal to the offset voltage of a PN junction, the difference in DC voltage levels between said input and output terminals being equal to the $1V_T$ offset voltage of said first output transistor, whereby under steady state conditions there is a difference in DC voltage levels of $1V_T$ between the base of said second output transistor and said output terminals, said $1V_T$ biasing said second output transistor conductive under steady state conditions, said input terminal adapted to receive binary logic signals at one or the other of two binary logic levels, said logic signals alternately driving said first and second transistors respectively into full conduction as said first and second transistors charge and discharge respectively capacitive loads which are connected to said output terminal, said first and second output transistors both biased conducting under steady state conditions after said capacitive loads are either charged up or discharged by current flowing from said first and second output transistors, respectively, said first output transistor biased nonconductive under transient conditions when the input signal applied to said input terminal is shifted to one binary level and prior to the complete discharging of said capacitive loads, and said second output transistor biased nonconductive under transient conditions when said input signals have shifted to another logical level and said capacitive loads have not fully charged up to a given level.

References Cited

UNITED STATES PATENTS

| | | | |
|---|---|---|---|
| 2,955,257 | 10/1960 | Lindsay | 330—13 |
| 3,281,703 | 10/1966 | Bladen | 330—17 |

ROY LAKE, *Primary Examiner.*

SIEGFRIED H. GRIMM, *Assistant Examiner.*

U.S. Cl. X.R.

330—17, 18; 307—270, 313